United States Patent
Furuya

(10) Patent No.: US 10,849,257 B2
(45) Date of Patent: Nov. 24, 2020

(54) MODULE

(71) Applicant: Murata Manufacturing Co., Ltd., Kyoto (JP)

(72) Inventor: Shin Furuya, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/427,843

(22) Filed: May 31, 2019

(65) Prior Publication Data

US 2019/0289758 A1    Sep. 19, 2019

Related U.S. Application Data

(63) Continuation of application No. PCT/JP2017/043916, filed on Dec. 7, 2017.

(30) Foreign Application Priority Data

Dec. 14, 2016    (JP) .................................. 2016-242334

(51) Int. Cl.
*H05K 9/00* (2006.01)
*H01L 23/31* (2006.01)
(Continued)

(52) U.S. Cl.
CPC ........... *H05K 9/0022* (2013.01); *H01L 23/00* (2013.01); *H01L 23/28* (2013.01);
(Continued)

(58) Field of Classification Search
CPC ...... H05K 9/0022; H05K 5/065; H05K 1/181; H05K 2201/10522; H05K 2201/10545;
(Continued)

(56) References Cited

U.S. PATENT DOCUMENTS 6,037,846 A * 3/2000 Oberhammer ..... H01R 13/7195
174/367
2006/0267159 A1* 11/2006 Yamamoto .......... H01L 23/3121
257/659
(Continued)

FOREIGN PATENT DOCUMENTS

JP    H04-58596 A    2/1992
JP    2014-107372 A    6/2014
(Continued)

OTHER PUBLICATIONS

International Search Report for International Application No. PCT/JP2017/043916 dated Feb. 20, 2018.
(Continued)

*Primary Examiner* — Daniel P Wicklund
*Assistant Examiner* — Sagar Shrestha
(74) *Attorney, Agent, or Firm* — Pearne & Gordon, LLP

(57) ABSTRACT

A first trench is formed in a first sealing resin layer, which seals first electronic components and second electronic components on one main surface of a circuit board, and a second trench is formed in a second sealing resin layer, which seals third electronic components and fourth electronic components on another main surface. The first trench is formed between the first electronic components and the second electronic components when viewed in plan view, extending from an upper surface of the first sealing resin layer toward a surface opposite from the one main surface of the first sealing resin layer, and the second trench is formed between the third electronic components and the fourth electronic components when viewed in plan view, extending from a lower surface of the second sealing resin layer toward a surface opposite from the other main surface of the second sealing resin layer.

8 Claims, 9 Drawing Sheets

(51) Int. Cl.

| | | |
|---|---|---|
| *H01L 23/538* | (2006.01) | |
| *H01L 23/552* | (2006.01) | |
| *H05K 1/18* | (2006.01) | |
| *H05K 5/06* | (2006.01) | |
| *H01L 23/28* | (2006.01) | |
| *H01L 23/00* | (2006.01) | |
| *H01L 25/065* | (2006.01) | |
| *H01L 25/07* | (2006.01) | |
| *H01L 25/18* | (2006.01) | |
| *H01L 25/16* | (2006.01) | |

(52) U.S. Cl.
CPC ........ *H01L 23/3121* (2013.01); *H01L 23/538* (2013.01); *H01L 23/552* (2013.01); *H01L 25/065* (2013.01); *H01L 25/07* (2013.01); *H01L 25/18* (2013.01); *H05K 1/181* (2013.01); *H05K 5/064* (2013.01); *H05K 5/065* (2013.01); *H05K 9/0037* (2013.01); *H01L 25/16* (2013.01); *H05K 2201/10522* (2013.01); *H05K 2201/10545* (2013.01)

(58) Field of Classification Search
CPC . H01L 23/552; H01L 23/3121; H01L 23/538; H01L 25/16
See application file for complete search history.

(56) References Cited

U.S. PATENT DOCUMENTS

| | | | | |
|---|---|---|---|---|
| 2010/0200965 | A1* | 8/2010 | Liao | ...................... H01L 23/552 257/659 |
| 2012/0008288 | A1* | 1/2012 | Tsukamoto | .......... H05K 9/0037 361/736 |
| 2013/0301227 | A1* | 11/2013 | Kawano | ................ H01L 21/561 361/748 |
| 2014/0085843 | A1* | 3/2014 | Otsubo | ................... H01L 23/13 361/760 |
| 2014/0361428 | A1 | 12/2014 | Park | |
| 2015/0043170 | A1 | 2/2015 | Shimamura et al. | |
| 2015/0043171 | A1* | 2/2015 | Mugiya | ................. H01L 23/552 361/728 |
| 2015/0043172 | A1 | 2/2015 | Mugiya et al. | |
| 2015/0043189 | A1* | 2/2015 | Kitazaki | ............. H01L 23/3121 361/816 |
| 2015/0131231 | A1 | 5/2015 | Yoo et al. | |
| 2016/0035678 | A1 | 2/2016 | Yoo et al. | |
| 2018/0096967 | A1* | 4/2018 | Tsai | ..................... H01L 23/552 |
| 2018/0151485 | A1* | 5/2018 | Kao | ...................... H01L 21/486 |

FOREIGN PATENT DOCUMENTS

| | | |
|---|---|---|
| JP | 2015-057802 A | 3/2015 |
| JP | 2015-057803 A | 3/2015 |

OTHER PUBLICATIONS

Written Opinion for International Application No. PCT/JP2017/043916 dated Feb. 20, 2018.

Office Action for Korean Patent Application No. 10-2019-7016496 dated Sep. 1, 2020.

* cited by examiner

PRIOR ART

MODULE

This is a continuation of International Application No. PCT/JP2017/043916 filed on Dec. 7, 2017 which claims priority from Japanese Patent Application No. 2016-242334 filed on Dec. 14, 2016. The contents of these applications are incorporated herein by reference in their entireties.

BACKGROUND

Technical Field

The present disclosure relates to a module in which a trench is formed in a sealing resin layer that seals a component mounted on a circuit board.

In a module where a plurality of electronic components such as semiconductor devices are mounted on a mounting surface of a circuit board, it is desirable that the level of integration of the electronic components be increased. However, as the level of integration of electronic components increases, there is a risk that unnecessary electromagnetic interference will arise among the electronic components. Thus, to suppress electromagnetic interference among electronic components in this type of module, covering the plurality of electronic components mounted on the mounting surface of the circuit board with a sealing resin layer, and then forming a trench in the sealing resin layer between some of the electronic components and other electronic components, has been proposed. The circuit module 100 disclosed in Patent Document 1 and illustrated in FIG. 11 is an example of such a module.

The circuit module 100 includes: a circuit board 101; mounted components 102a and 102b mounted on one main surface 101a of the circuit board 101; a sealing member 103, in which a trench 104 is formed between the mounted component 102a and the mounted component 102b, and which seals the mounted components 102a and 102b; and a shield 105. The shield 105 has an outer shield part 105a that covers an upper surface and side surfaces of the sealing member 103, and an inner shield part 105b formed within the trench 104.

Patent Document 1: Japanese Unexamined Patent Application Publication No. 2015-57802 (see paragraphs 0022 to 0042 and FIG. 4)

BRIEF SUMMARY

However, although the above-described circuit module 100 can reduce interference caused by unnecessary electromagnetic waves between the mounted component 102a and the mounted component 102b, the circuit module 100 cannot achieve a sufficiently high level of mounted component integration.

The present disclosure provides a module capable of reducing interference caused by unnecessary electromagnetic waves among a plurality of components mounted on a circuit board, and capable of achieving a higher level of integration of the components mounted on the circuit board.

A module according to the present disclosure includes: a circuit board having one main surface and another main surface; a first component and a second component mounted on the one main surface; a first sealing resin layer that seals the one main surface, and the first component and the second component; a third component and a fourth component mounted on the other main surface; and a second sealing resin layer that seals the other main surface, and the third component and the fourth component. A first trench is formed in the first sealing resin layer, the first trench being formed between the first component and the second component when viewed in plan view from a direction perpendicular to the one main surface. A second trench is formed in the second sealing resin layer, the second trench being formed between the third component and the fourth component when viewed in the plan view. The module further includes a first shield part disposed in the first trench, and a second shield part disposed in the second trench.

According to this configuration, interference caused by unnecessary electromagnetic waves between the first component and the second component, and interference caused by unnecessary electromagnetic waves between the third component and the fourth component, can be reduced, and a higher level of integration of the components mounted on the circuit board can be achieved. This increases the freedom with which the layout can be designed.

Additionally, the first trench and the second trench may be formed so as to have parts that overlap with each other in the plan view; and at least one of the first trench and the second trench may be formed so that at the part where the trenches overlap with each other, the first trench does not pass through the first sealing resin layer, or the second trench does not pass through the second sealing resin layer. According to this configuration, at least one of a part of the circuit board on the one main surface side and a part of the circuit board on the other main surface side can be prevented from being damaged at the part where the first trench and the second trench overlap in plan view, when forming the first trench and the second trench through laser processing, for example. This makes it possible to suppress breakage in the circuit board.

Additionally, the module may further include: a mounting terminal electrode formed on the other main surface, the mounting terminal electrode being exposed from the second sealing resin layer; and a third shield part that covers the second sealing resin layer while being separated from an exposed surface of the mounting terminal electrode. According to this configuration, the entry of unnecessary electromagnetic waves into the module from the exterior, and leakage of unnecessary electromagnetic waves from the module to the exterior, can be prevented by the third shield part, while avoiding electrically connecting the mounting terminal electrode to the third shield part.

Additionally, the first trench and the second trench may be formed so as not to overlap when viewed in the plan view. According to this configuration, at least a part of the circuit board on the other main surface side can be prevented from being damaged at the part where the first trench is formed in the plan view, and a part of the circuit board on the one main surface side can be prevented from being damaged at the part where the second trench is formed in the plan view, when forming the first trench and the second trench through laser processing, for example. This makes it possible to suppress breakage in the circuit board.

Additionally, the module may further include a fourth shield part layered on a side surface of each of the first sealing resin layer, the second sealing resin layer, and the circuit board. According to this configuration, the entry of unnecessary electromagnetic waves into the module from the exterior, and leakage of unnecessary electromagnetic waves from the module to the exterior, can be prevented by the fourth shield part.

According to the present disclosure, interference caused by unnecessary electromagnetic waves among a plurality of components mounted on both surfaces of a circuit board can be reduced, and a higher level of integration of the components mounted on the circuit board can be achieved. This increases the freedom with which the layout can be designed.

BRIEF DESCRIPTION OF THE SEVERAL VIEWS OF THE DRAWINGS

FIG. 1A is a perspective view of the top of the module from an oblique direction, and FIG. 1B is a perspective view of the bottom of the module from an oblique direction.

FIG. 8A is a plan view of the module before the module is sealed with a resin, and FIG. 8B is a bottom view of the module before the module is sealed with a resin.

DETAILED DESCRIPTION

First Embodiment

Figure 1A:
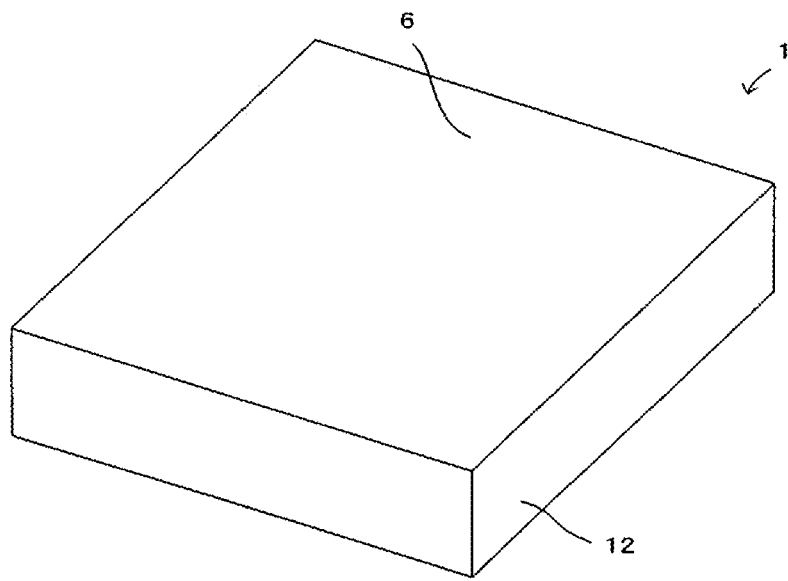
FIGS. 1A and 1B illustrate perspective views of a module according to a first embodiment of the present disclosure, where
Figure 1B:
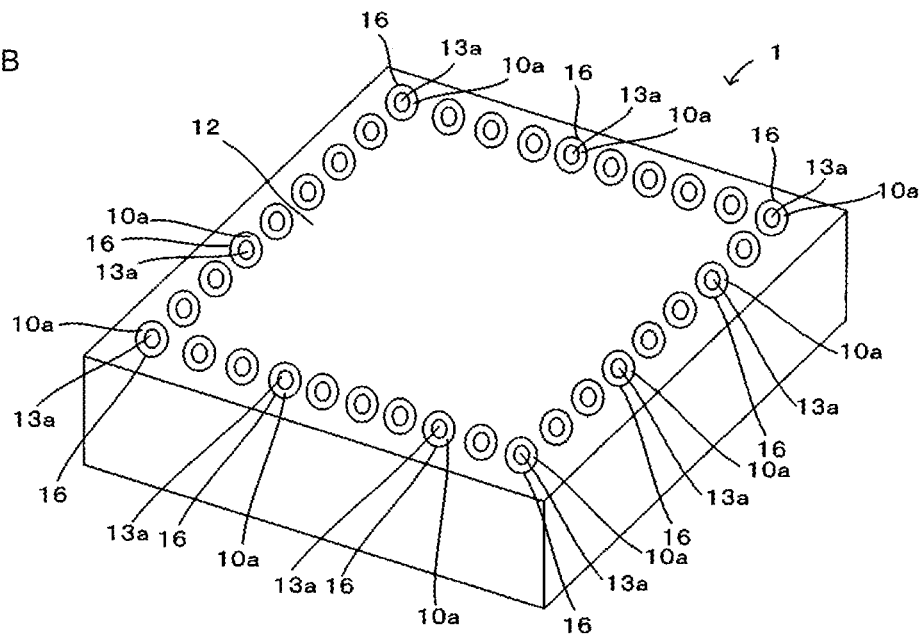
Figure 2:
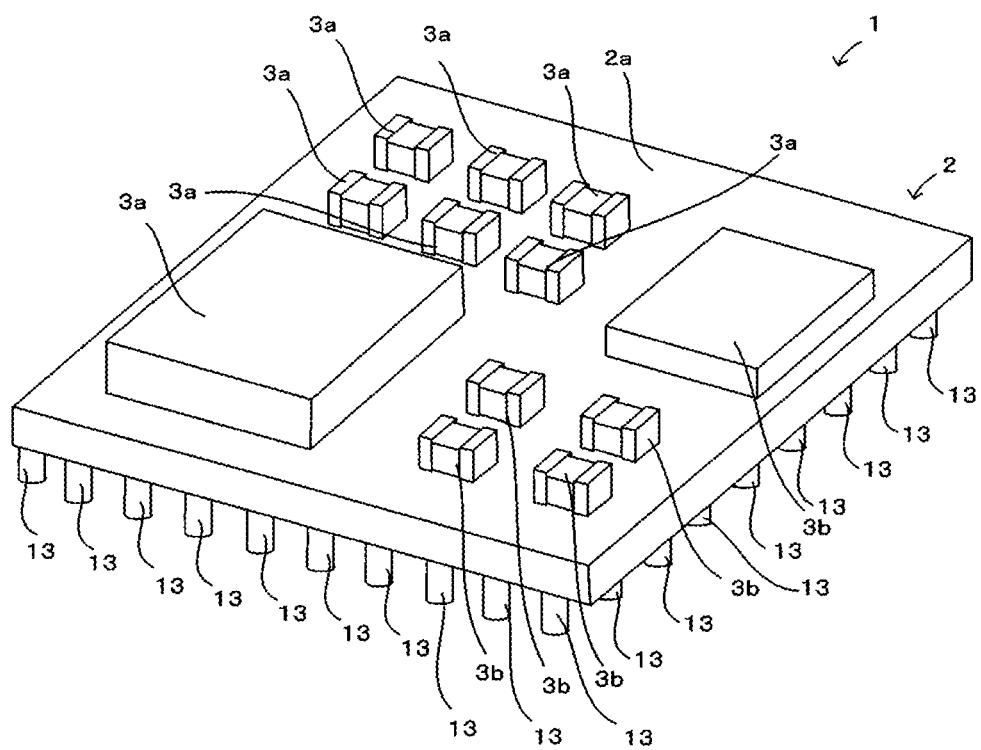
FIG. 2 is a perspective view of the top of the module illustrated in FIGS. 1A and 1B, from an oblique direction, before the module is sealed with a resin.
Figure 3A:
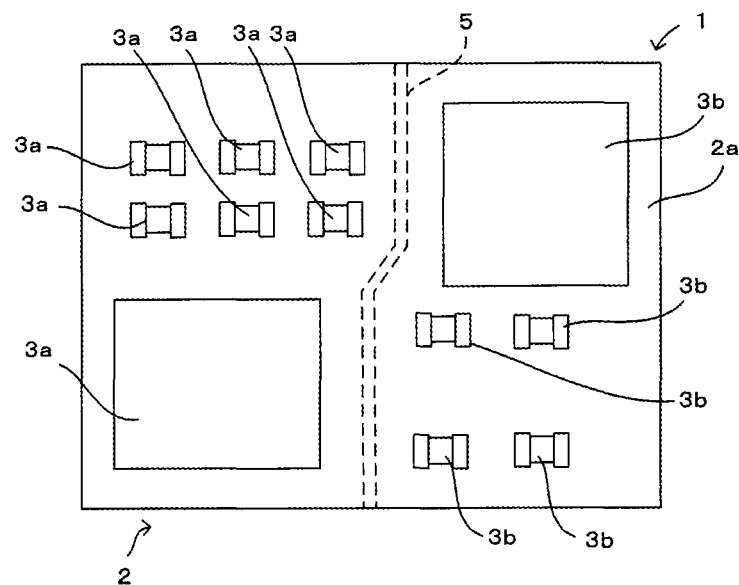
FIG. 3A is a plan view of the module illustrated in FIG. 1A, before the module is sealed with a resin.
Figure 3B:
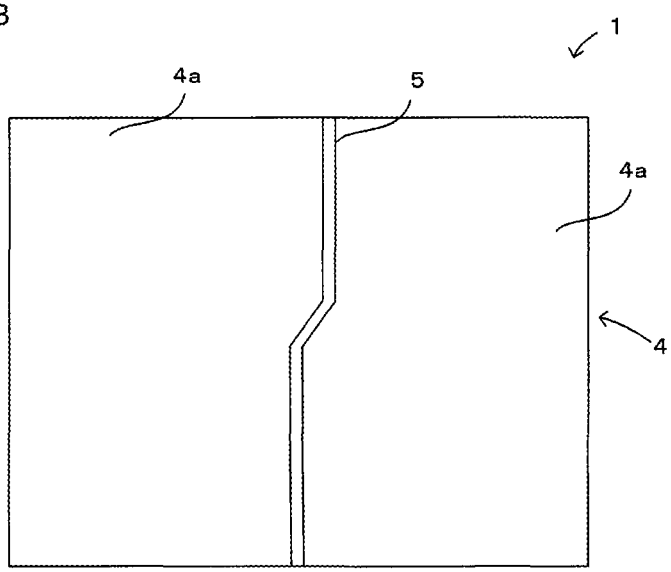
FIG. 3B is a plan view of the module illustrated in FIG. 1A, after the module is sealed with a resin and a trench has been formed in the resin.
Figure 4A:
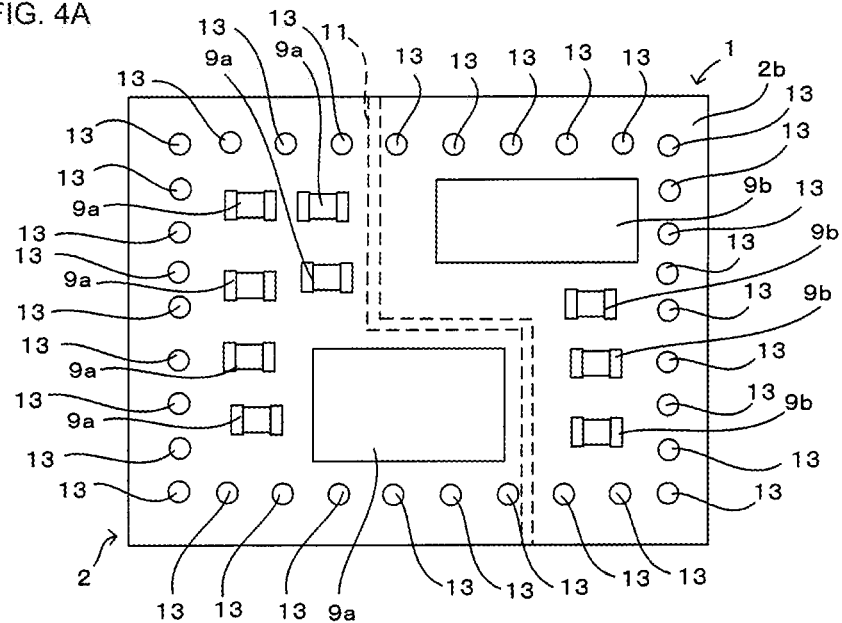
FIG. 4A is a bottom view of the module illustrated in FIG. 1B, before the module is sealed with a resin.
Figure 4B:
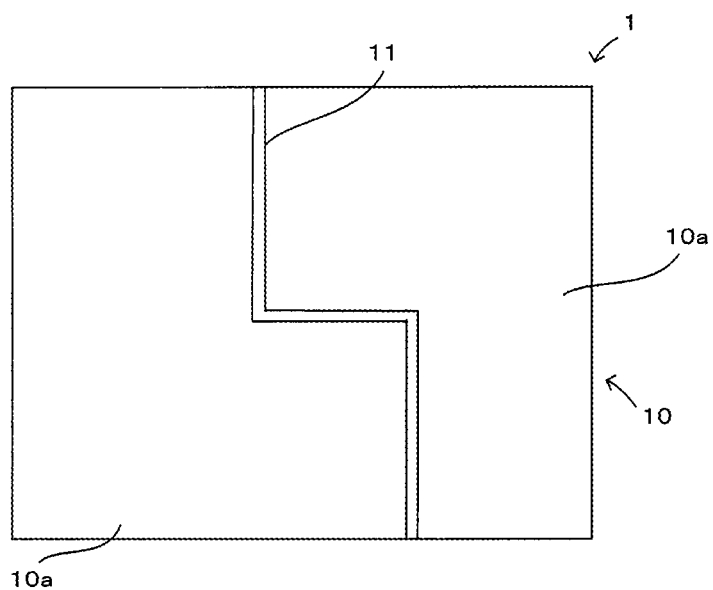
FIG. 4B is a bottom view of the module illustrated in FIG. 1B, after the module is sealed with a resin and a trench has been formed in the resin.
Figure 5:
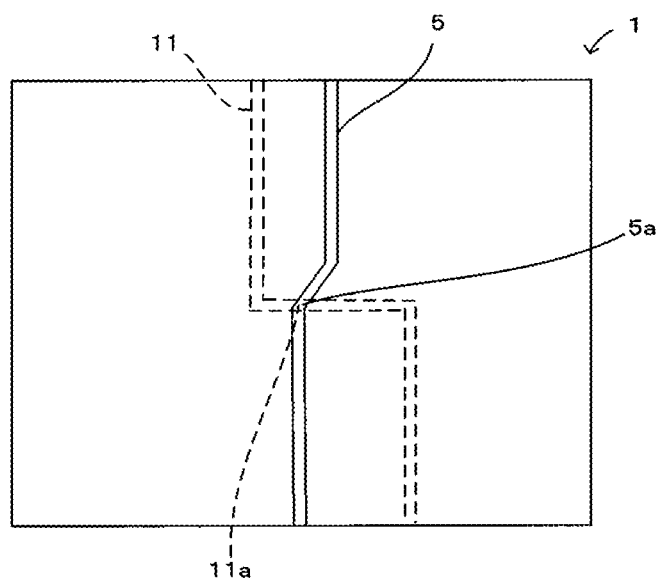
FIG. 5 is a diagram illustrating a positional relationship between trenches formed over the top and bottom of a circuit board in the module illustrated in FIGS. 3B and 4B.
Figure 6:
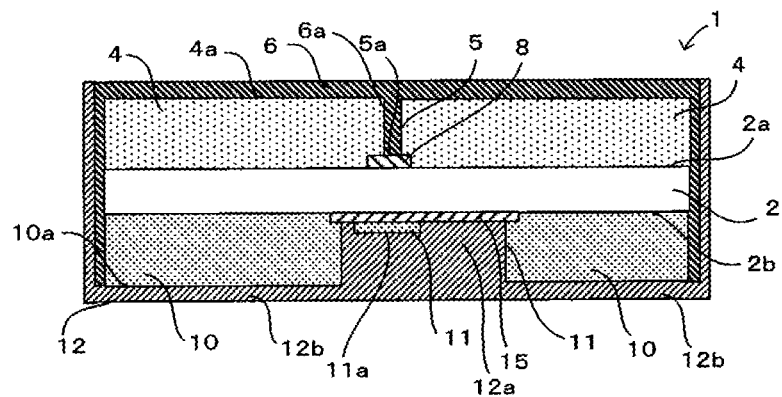
FIG. 6 is one cross-sectional view of the module illustrated in FIGS. 1A and 1B.
Figure 7:
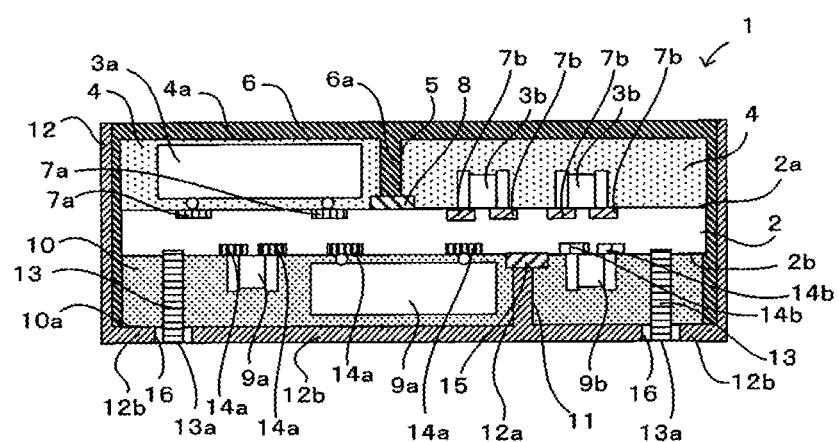
FIG. 7 is another cross-sectional view of the module illustrated in FIGS. 1A and 1B.

A module 1 according to a first embodiment of the present disclosure will be described with reference to FIGS. 1A through 7. FIGS. 1A and 1B illustrate perspective views of the module 1, where FIG. 1A is a perspective view of the top of the module 1 from an oblique direction, and FIG. 1B is a perspective view of the bottom of the module 1 from an oblique direction. FIG. 2 is a perspective view of the top of the module 1 illustrated in FIG. 1A, from an oblique direction, before the module is sealed with a resin. FIG. 3A is a plan view of the module 1 illustrated in FIG. 1A, before sealing with a resin, and FIG. 3B is a plan view of the module 1 illustrated in FIG. 1A, after the module is sealed with a resin and a trench is formed in the resin. Note that a first trench 5 illustrated in FIG. 3A is not actually present in the plan view of the module 1 before the module 1 is sealed with a resin, but is illustrated as an imaginary line for the sake of understanding, in order to clarify the positional relationship between the first trench 5, and first electronic components 3a and second electronic components 3b, when viewed in plan view. FIG. 4A is a bottom view of the module 1 illustrated in FIG. 1B, before sealing with a resin, and FIG. 4B is a bottom view of the module 1 illustrated in FIG. 1B, after the module is sealed with a resin and a trench is formed in the resin. Note that a second trench 11 illustrated in FIG. 4A is not actually present in the bottom view of the module 1 before the module 1 is sealed with a resin, but is illustrated as an imaginary line for the sake of understanding, in order to clarify the positional relationship between the second trench 11, and third electronic components 9a and fourth electronic components 9b, when viewed in plan view. FIG. 5 is a diagram illustrating a positional relationship between the trenches formed on the top and bottom of a circuit board in the module 1 illustrated in FIGS. 3B and 4B (the first trench 5 and the second trench 11), when viewed in plan view. FIG. 6 is one cross-sectional view of the module 1 illustrated in FIGS. 1A and 1B, and is a cross-sectional view illustrating a location including a part where the trenches formed over the top and under the bottom of the circuit board overlap with each other when viewed in plan view. FIG. 7 is another cross-sectional view of the module 1 illustrated in FIGS. 1A and 1B, and is a cross-sectional view illustrating a location not including a part where the trenches formed over the top and under the bottom of the circuit board overlap with each other when viewed in plan view. Note that "plan view" as used in the embodiments of the disclosure refers to a plan view taken from a direction perpendicular to one main surface 2a of a circuit board 2.

The module 1 according to the first embodiment is installed in a motherboard or the like of an electronic device that uses high-frequency signals, for example. The module 1 includes: the circuit board 2, which has the one main surface 2a and another main surface 2b (see FIGS. 2, 3A, 4A, 6, and 7); a plurality of the first electronic components 3a and a plurality of the second electronic components 3b mounted on the one main surface 2a of the circuit board 2 (see FIGS. 2, 3A, and 7); and a first sealing resin layer 4, in which the first trench 5 is formed, and which seals the electronic components 3a, 3b, and the like (see FIGS. 3B, 6, and 7). Additionally, the module 1 includes: a plurality of the third electronic components 9a and a plurality of the fourth electronic components 9b mounted on the other main surface 2b of the circuit board 2 (see FIGS. 4A and 7); and a second sealing resin layer 10, in which the second trench 11 is formed, and which seals the electronic components 9a, 9b, and the like (see FIGS. 4B, 6, and 7). Furthermore, the module 1 includes: a first shield layer 6, which covers part of a surface of the first sealing resin layer 4, a side surface of the circuit board 2, and a side surface of the second sealing resin layer 10 (see FIGS. 1A, 6, and 7); and a second shield layer 12, which covers part of a surface of the second sealing resin layer 10 and a side surface of the first shield layer 6 (see FIGS. 1A, 1B, 6, and 7).

The circuit board 2 is formed from low temperature co-fired ceramics, glass epoxy resin, or the like, for example, and as illustrated in FIG. 7, a plurality of first land electrodes 7a on which the first electronic components 3a are mounted, and a plurality of second land electrodes 7b on which the second electronic components 3b are mounted, are formed on the one main surface 2a. Additionally, as illustrated in FIG. 7, a plurality of third land electrodes 14a on which the third electronic components 9a are mounted, and a plurality of fourth land electrodes 14b on which the fourth electronic components 9b are mounted, are formed on the other main surface 2b; and as illustrated in FIGS. 2, 4A, and 7, a plurality of mounting terminal electrodes 13 for exchanging signals with an external device are disposed on the other main surface 2b. As illustrated in FIGS. 6 and 7, a first metal film 8 is disposed on the one main surface 2a of the circuit board 2, and a second metal film 15 is disposed on the other main surface 2b. Note that the first metal film 8 is disposed in a position corresponding to the first trench 5 formed in the first sealing resin layer 4, and the second metal film 15 is disposed in a position corresponding to the second trench 11 formed in the second sealing resin layer 10. Furthermore, a plurality of ground electrodes (not shown), a plurality of types of wiring electrodes (not shown), and a plurality of via conductors (not shown) are also formed in inner layers and the like of the circuit board 2. Here, the ground electrodes are formed so as to be exposed from the side surface of the circuit board 2, for example, and are electrically connected to the first shield layer 6.

The first land electrodes 7a, the second land electrodes 7b, the third land electrodes 14a, the fourth land electrodes 14b, the ground electrodes, and the wiring electrodes are formed from a metal typically employed for wiring electrodes, such as Cu, Al, or the like. The via conductors are formed from a metal such as Ag, Cu, or the like. The first land electrodes 7a, the second land electrodes 7b, the third land electrodes 14a, the fourth land electrodes 14b, and the mounting terminal electrodes 13 may be plated with Ni/Au plating. The first metal film 8 and the second metal film 15 are formed from a metal such as Ag, Cu, or the like. The mounting terminal electrodes 13 are formed from a metal such as Ag, Cu, or the like.

Semiconductor devices formed from semiconductors such as Si or GaAs, chip components such as chip inductors, chip capacitors, or chip resistors, or the like can be given as examples of the first electronic components 3a, the second electronic components 3b, the third electronic components 9a, and the fourth electronic components 9b.

As illustrated in FIGS. 6 and 7, the first sealing resin layer 4 is provided so as to cover the one main surface 2a of the circuit board 2, the first electronic components 3a, and the second electronic components 3b, except for part of the first metal film 8 disposed on the one main surface 2a of the circuit board 2. The first trench 5 is formed in the first sealing resin layer 4, as illustrated in FIGS. 3B, 6, and 7. In other words, the first trench 5 is provided from the upper surface side of the first sealing resin layer 4, toward the one main surface 2a of the circuit board 2. The first sealing resin layer 4 can be formed from a resin typically employed as a sealing resin, such as epoxy resin. Note that the position where the first trench 5 is formed and the like will be described in detail later.

As illustrated in FIGS. 6 and 7, the first shield layer 6 is provided so as to cover an upper surface 4a of the first sealing resin layer 4 (the surface of the first sealing resin layer 4 on the opposite side from the surface that faces the one main surface 2a) and side surfaces of the first sealing resin layer 4, side surfaces of the circuit board 2, and side surfaces of the second sealing resin layer 10, and is provided so as to fill the first trench 5. The first shield layer 6 is for reducing leakage of unnecessary electromagnetic waves, which are emitted from the first electronic components 3a, the second electronic components 3b, the wiring electrodes, and the like of the module 1, to the exterior, reducing situations where unnecessary electromagnetic waves, which are emitted from an external device, reach the first electronic components 3a, the second electronic components 3b, the wiring electrodes, and the like of the module 1, and so on. The first shield layer 6 can be formed from a conductive material such as Cu, Ag, Al, or the like for example. Note that a part 6a of the first shield layer 6, which fills the first trench 5, corresponds to a "first shield part" of the present disclosure.

As illustrated in FIGS. 6 and 7, the second sealing resin layer 10 is provided so as to cover the other main surface 2b of the circuit board 2, the third electronic components 9a, the fourth electronic components 9b, and the mounting terminal electrodes 13, except for part of the second metal film 15 disposed on the other main surface 2b of the circuit board 2 and surfaces 13a of the mounting terminal electrodes 13, which are located on the sides opposite from the surfaces facing the other main surface 2b of the circuit board 2. The second trench 11 is formed in the second sealing resin layer 10, as illustrated in FIGS. 4B, 6, and 7. In other words, the second trench 11 is provided from the lower surface side of the second sealing resin layer 10, toward the other main surface 2b of the circuit board 2. The second sealing resin layer 10 can be formed from a resin typically employed as a sealing resin, such as epoxy resin. As illustrated in FIGS. 1B and 7, the surfaces 13a of the mounting terminal electrodes 13 are exposed from the second sealing resin layer 10. Note that the position where the second trench 11 is formed and the like will be described in detail later.

As illustrated in FIGS. 6 and 7, the second shield layer 12 is provided so as to cover a partial area of a lower surface 10a of the second sealing resin layer 10 (the surface of the second sealing resin layer 10 on the opposite side from the surface that faces the other main surface 2b) and side surfaces of the first shield layer 6, and is provided so as to fill the second trench 11. The second shield layer 12 is for reducing leakage of unnecessary electromagnetic waves, which are emitted from the third electronic components 9a, the fourth electronic components 9b, the wiring electrodes, and the like of the module 1, to the exterior, reducing situations where unnecessary electromagnetic waves, which are emitted from an external device, reach the third electronic components 9a, the fourth electronic components 9b, the wiring electrodes, and the like of the module 1, and so on. The second shield layer 12 can be formed from a conductive material such as Cu, Ag, Al, or the like for example. Note that a part 12a of the second shield layer 12, which fills the second trench 11, corresponds to a "second shield part" of the present disclosure.

Here, the partial area of the lower surface 10a of the second sealing resin layer 10, which is covered by the second shield layer 12, will be described. As illustrated in FIGS. 1B and 7, the second shield layer 12 covers a covered area (corresponding to the partial area of the lower surface 10a of the second sealing resin layer 10) that, of the lower surface 10a of the second sealing resin layer 10, does not include areas where the surfaces 13a of the mounting terminal electrodes 13 are present, and peripheral areas around the areas where the surfaces 13a are present. In other words, openings 16 are formed in the second shield layer 12 so that when viewed in plan view, there are no areas overlapping with the surfaces 13a of the mounting terminal electrodes 13 and there are no peripheral parts overlapping with the peripheries of the surfaces 13a of the mounting terminal electrodes 13, and the lower surface 10a of the second sealing resin layer 10 is exposed between the second shield layer 12 and the surfaces 13a of the mounting terminal electrodes 13. In other words, the second shield layer 12 covers the lower surface 10a of the second sealing resin layer 10 while being separated from the mounting terminal electrodes 13. In this manner, the mounting terminal electrodes 13 and the second shield layer 12 are electrically insulated. Note that a part 12b of the second shield layer 12, which covers the partial area of the lower surface 10a of the second sealing resin layer 10, corresponds to a "third shield part" of the present disclosure.

Next, the positions where the first trench 5 and the second trench 11 are formed and the like will be described in detail.

As illustrated in FIGS. 3A and 3B, the first trench 5 is formed in the first sealing resin layer 4 so as to be positioned between the first electronic components 3a and the second electronic components 3b when viewed in plan view. As illustrated in FIGS. 4A and 4B, the second trench 11 is formed in the second sealing resin layer 10 so as to be positioned between the third electronic components 9a and the fourth electronic components 9b when viewed in plan view. The first trench 5 and the second trench 11 have parts that overlap with each other when viewed in plan view, as illustrated in FIGS. 5 and 6. Note that the part of the first trench 5 corresponding to the overlapping part will be called an overlapping part 5a, and the part of the second trench 11 corresponding to the overlapping part will be called an overlapping part 11a.

As illustrated in FIGS. 6 and 7, the first trench 5 is formed extending from the upper surface 4a of the first sealing resin layer 4, toward the surface on the side opposite from the upper surface 4a of the first sealing resin layer 4 and reaching that opposite-side surface. In other words, the first trench 5 passes through the first sealing resin layer 4. As illustrated in FIG. 6, the first trench 5 passes through the first sealing resin layer 4 at the overlapping part 5a as well.

As illustrated in FIG. 6, the second trench 11 is formed extending from the lower surface 10a of the second sealing resin layer 10, toward the surface on the side opposite from the lower surface 10a of the second sealing resin layer 10, but not reaching that opposite-side surface in a part including the overlapping part 11a; but as illustrated in FIGS. 6 and 7, the second trench 11 is formed reaching that opposite-side surface in a part not including the overlapping part 11a. In other words, the second trench 11 does not pass through the second sealing resin layer 10 in the part including the overlapping part 11a but does pass through the second sealing resin layer 10 in the part not including the overlapping part 11a.

(Method of Manufacturing Module)

A method of manufacturing the module 1 will be described next.

First, the circuit board 2 is prepared. The plurality of first land electrodes 7a and second land electrodes 7b are formed, and the first metal film 8 is disposed, on the one main surface 2a of the circuit board 2. Additionally, the plurality of third land electrodes 14a and the plurality of fourth land electrodes 14b are formed, the plurality of mounting terminal electrodes 13 are disposed, and the second metal film 15 is disposed, on the other main surface 2b of the circuit board 2. Furthermore, the plurality of ground electrodes, the plurality of types of wiring electrodes, the plurality of via conductors, and the like are formed in the inner layers and the like of the circuit board 2. The first land electrodes 7a, the second land electrodes 7b, the third land electrodes 14a, the fourth land electrodes 14b, the first metal film 8, the second metal film 15, the ground electrodes, and the wiring electrodes can be formed by, for example, screen-printing a conductive paste containing a metal such as Ag, Cu, or the like. The via conductors can be formed by first using a laser or the like to form via holes and then employing a known method. The mounting terminal electrodes 13 can be formed by metal having a rod shape.

Next, the plurality of first electronic components 3a and the plurality of second electronic components 3b are mounted on the one main surface 2a of the circuit board 2 using known surface mount technology. Additionally, the plurality of third electronic components 9a and the plurality of fourth electronic components 9b are mounted on the other main surface 2b of the circuit board 2 using known surface mount technology.

Next, the first sealing resin layer 4 is formed on the one main surface 2a of the circuit board 2 so as to cover the one main surface 2a of the circuit board 2, the first electronic components 3a and the second electronic components 3b mounted on the one main surface 2a, and the first metal film 8. Likewise, the second sealing resin layer 10 is formed on the other main surface 2b of the circuit board 2 so as to cover the other main surface 2b of the circuit board 2, the third electronic components 9a and the fourth electronic components 9b mounted on the other main surface 2b, the mounting terminal electrodes 13, and the second metal film 15. A spreading technique, a printing technique, a compression molding technique, a transfer molding technique, or the like can be used to form the first sealing resin layer 4, for example. Furthermore, the surface of the first sealing resin layer 4 is polished or ground to flatten the surface of the first sealing resin layer 4. Additionally, the surface of the second sealing resin layer 10 is polished or ground to flatten the surface of the second sealing resin layer 10. At this time, the surface of the second sealing resin layer 10 is polished or ground until the surfaces 13a of the mounting terminal electrodes 13 are exposed from the lower surface 10a of the second sealing resin layer 10.

Next, the first trench 5 is formed between the first electronic components 3a and the second electronic components 3b when the first sealing resin layer 4 is viewed in plan view, by emitting a laser between the first electronic components 3a and the second electronic components 3b when the first sealing resin layer 4 is viewed in plan view. The first trench 5 is formed through this laser emission until the first trench 5 extends from the upper surface 4a of the first sealing resin layer 4 to the surface on the side opposite from the upper surface 4a of the first sealing resin layer 4. Note that the first metal film 8 is an element for preventing the one main surface 2a of the circuit board 2 from being directly irradiated with the laser and damaged. Additionally, the second trench 11 is formed between the third electronic components 9a and the fourth electronic components 9b when the second sealing resin layer 10 is viewed in plan view, by emitting a laser between the third electronic components 9a and the fourth electronic components 9b when the second sealing resin layer 10 is viewed in plan view. The formation of the second trench 11 through this laser emission is carried out until, in the part that does not include the overlapping part 11a, the second trench 11 extends from the lower surface 10a of the second sealing resin layer 10 to the surface on the side opposite from the lower surface 10a of the second sealing resin layer 10, and, in the part that includes the overlapping part 11a, from the lower surface 10a of the second sealing resin layer 10 toward the surface on the side opposite from the lower surface 10a of the second sealing resin layer 10, up to a position before the second trench 11 reaches that opposite-side surface. Note that the second metal film 15 is an element for preventing the other main surface 2b of the circuit board 2 from being directly irradiated with the laser and damaged.

Next, the first shield layer 6 is formed so as to cover the upper surface 4a and the side surfaces of the first sealing resin layer 4, the side surfaces of the circuit board 2, and the side surfaces of the second sealing resin layer 10, and so as to fill the first trench 5. For example, sputtering, vapor deposition, a paste application technique, or the like can be used to form the first shield layer 6. The second shield layer 12 is formed so as to cover the covered area of the lower surface 10a of the second sealing resin layer 10 and the side surfaces of the first shield layer 6, and so as to fill the second trench 11. For example, sputtering, vapor deposition, a paste application technique, or the like can be used to form the second shield layer 12. Note that the openings 16 can be formed in the second shield layer 12 by applying a mask to the areas aside from the covered area of the lower surface 10a of the second sealing resin layer 10.

Thus, according to the above-described first embodiment, the first electronic components 3a and the second electronic components 3b are mounted on the one main surface 2a of the circuit board 2, and the third electronic components 9a and the fourth electronic components 9b are mounted on the other main surface 2b. Additionally, the first trench 5 is formed in the first sealing resin layer 4 between the first electronic components 3a and the second electronic components 3b when viewed in plan view, and the second trench 11 is formed in the second sealing resin layer 10 between the third electronic components 9a and the fourth electronic components 9b when viewed in plan view. Additionally, the first shield layer 6 is formed so as to cover the upper surface 4a and side surfaces of the first sealing resin layer 4, the side surfaces of the circuit board 2, and the side surfaces of the second sealing resin layer 10, and so as to fill the first trench 5. Furthermore, the second shield layer 12 is formed so as to cover the lower surface 10a of the second sealing resin layer 10 while being separate from the surfaces 13a of the mounting terminal electrodes 13, cover the side surfaces of the first shield layer 6, and fill the second trench 11. Accordingly, unnecessary electromagnetic waves produced by the first electronic components 3a, the second electronic components 3b, the third electronic components 9a, the fourth electronic components 9b, the wiring electrodes, and the like can be prevented from leaking to the exterior of the module 1 from the upper surface, the side surfaces, and the lower surface of the module 1, and unnecessary electromagnetic waves produced by external devices can be prevented from entering into the module 1 from the upper surface, the side surfaces, and the lower surface of the module 1. Additionally, interference caused by unnecessary electromagnetic waves between the first electronic components 3a and the second electronic components 3b, and interference caused by unnecessary electromagnetic waves between the third electronic components 9a and the fourth electronic components 9b, can be reduced. A higher level of integration of the components mounted on the circuit board 2 can also be achieved.

Additionally, a plurality of components that produce a large amount of unnecessary electromagnetic waves can be divided between the one main surface 2a side and the other main surface 2b side; furthermore, this plurality of components can also be divided on the one main surface 2a by using the first shield part 6a disposed in the first trench 5, and on the other main surface 2b by using the second shield part 12a disposed in the second trench 11. This increases the freedom with which the layout can be designed.

Additionally, at the part where the first trench 5 and the second trench 11 overlap when viewed in plan view, the second trench 11 is formed so as not to pass through the second sealing resin layer 10. Accordingly, the other main surface 2b part of the circuit board 2 can be prevented from being damaged at the part where the first trench 5 and the second trench 11 overlap in plan view, when forming the first trench 5 and the second trench 11 through laser processing, for example. This makes it possible to suppress breakage in the circuit board.

Normally, the first shield layer 6 tends to be thinner at the side surfaces of the module 1 than at the upper surface, and the second shield layer 12 tends to be thinner at the side surfaces of the module 1 than at the lower surface. However, in the module 1, the side surfaces of the module 1 are covered by two layers, i.e., the first shield layer 6 and the second shield layer 12, which makes it possible to increase the thickness of the shield layers (the combined thickness of the first shield layer 6 and the second shield layer 12) at the side surfaces of the module 1. Accordingly, the module 1 can effectively reduce the entry of electromagnetic waves into the module 1 from the side surfaces of the module 1, and the leakage of electromagnetic waves to the exterior of the module 1 from the side surfaces of the module 1. To describe in more detail, in a case that the shield layer (the second shield layer 12) is not provided on the lower surface side of the module 1, the ratio between the upper surface thickness and the side surface thickness of the shield layers of the module 1 will be approximately 4:1, but providing two shield layers in the module 1 (the first shield layer 6 and the second shield layer 12) brings the ratio between the upper surface thickness and the side surface thickness of the shield layers of the module 1 to approximately 2:1. Shield films having a sufficient thickness can therefore be provided on the side surfaces of the module 1 as well, which makes it possible to improve the shield effect of the side surfaces. Note that the parts of the first shield layer 6 on the side surfaces of the module 1 and the parts of the second shield layer 12 on the side surfaces of the module 1 correspond to a "fourth shield part" of the present disclosure.

Second Embodiment

Figure 8A:
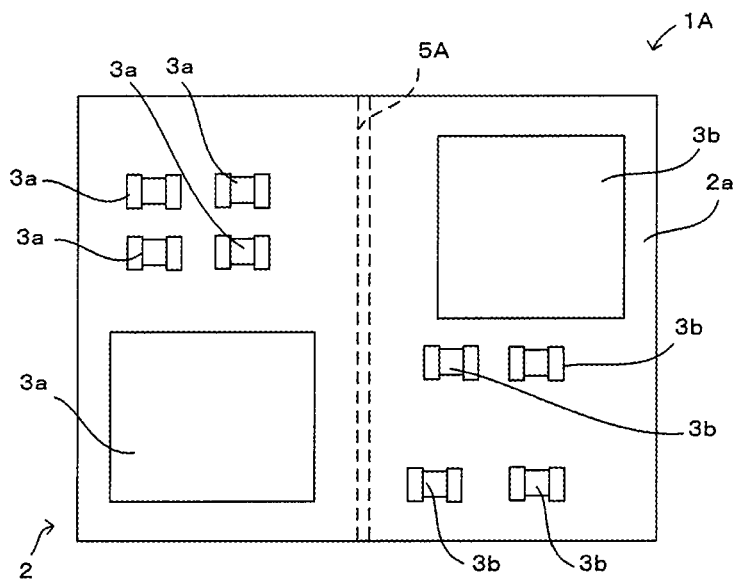
FIGS. 8A and 8B illustrate diagrams illustrating a module according to a second embodiment of the present disclosure, where
Figure 8B:
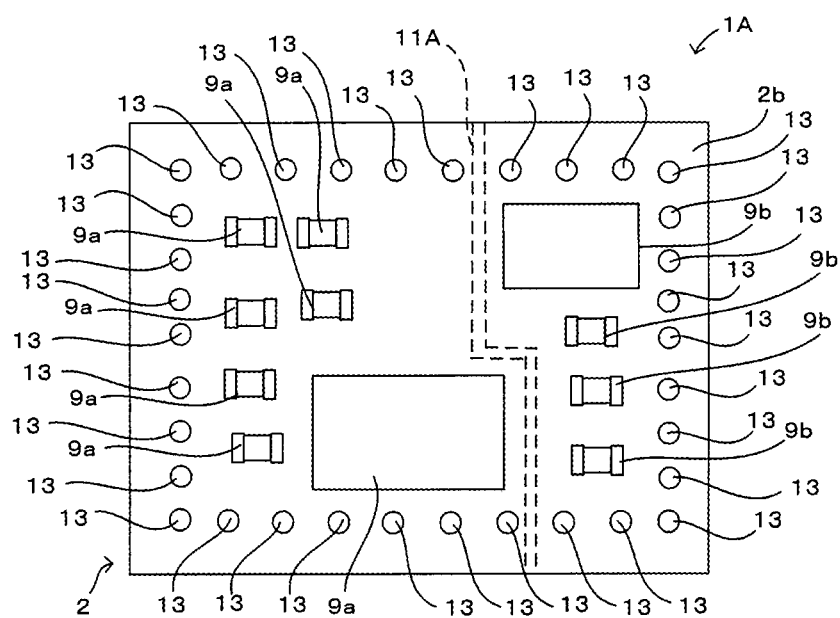
Figure 9:
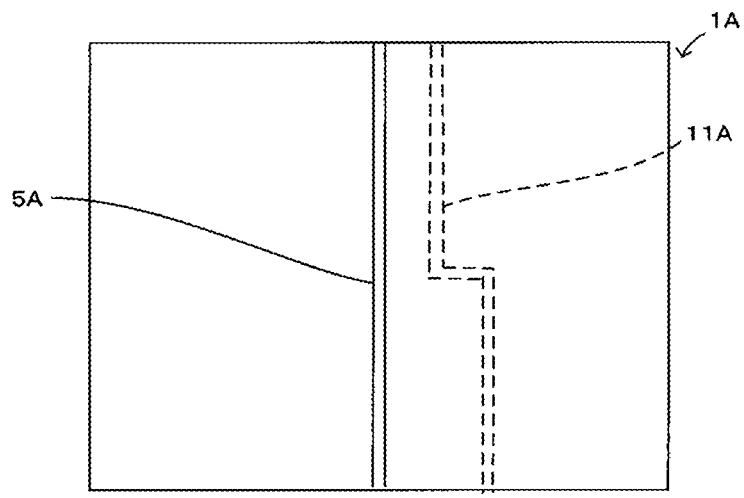
FIG. 9 is a diagram illustrating a positional relationship between trenches formed over the top and under the bottom of a circuit board in the module according to the second embodiment.
Figure 10:
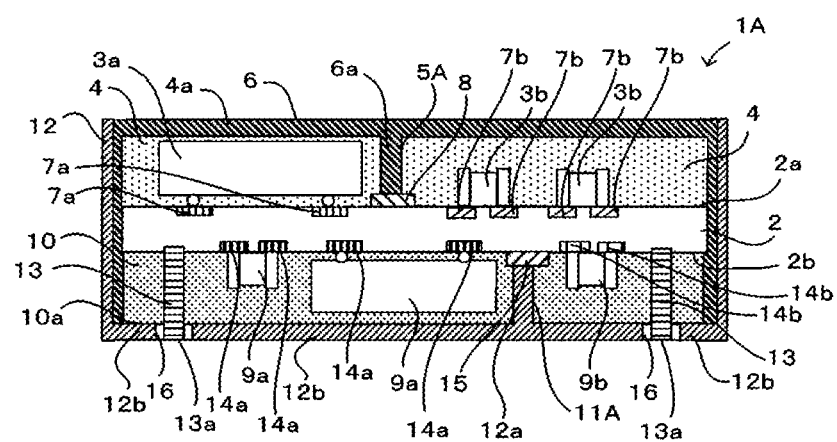
FIG. 10 is a cross-sectional view of the module according to the second embodiment.
Figure 11:
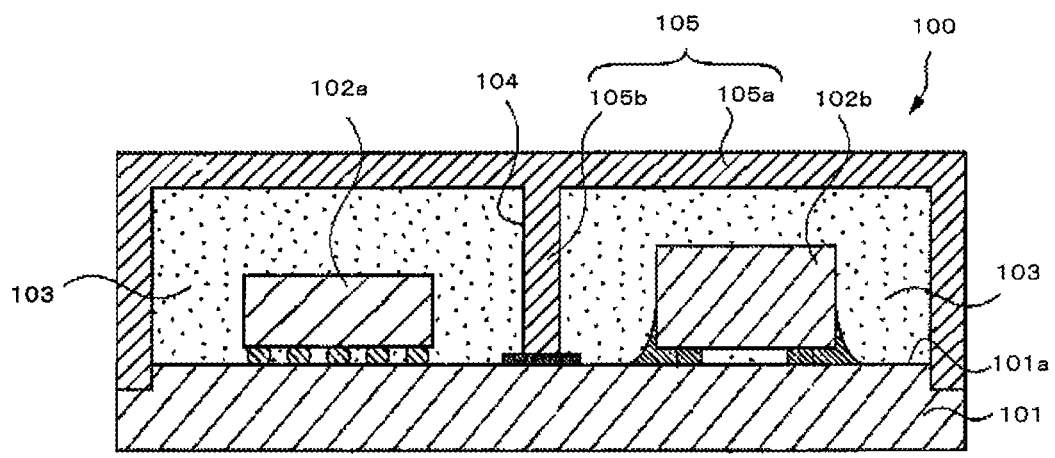
FIG. 11 is a cross-sectional view of a conventional module.

A module according to a second embodiment of the present disclosure will be described with reference to FIGS. 8A through 10. Note that FIG. 8A is a plan view illustrating a module 1A according to the second embodiment, before the module 1A is sealed with a resin, and FIG. 8B is a bottom view of the module 1A, before the module 1A is sealed with a resin. Note that a first trench 5A illustrated in FIG. 8A is not actually present in the plan view of the module 1A before the module 1A is sealed with a resin, but is illustrated as an imaginary line for the sake of understanding, in order to clarify the positional relationship between the first trench 5A, and the first electronic components 3a and the second electronic components 3b, when viewed in plan view. Additionally, a second trench 11A illustrated in FIG. 8B is not actually present in the bottom view of the module 1A before the module 1A is sealed with a resin, but is illustrated as an imaginary line for the sake of understanding, in order to clarify the positional relationship between the second trench 11A, and the third electronic components 9a and the fourth electronic components 9b, when viewed in plan view. FIG. 9 is a diagram illustrating a positional relationship between trenches (the first trench 5A and the second trench 11A) formed on the top and bottom of a circuit board in the module 1A. FIG. 10 is a cross-sectional view of the module 1A.

The module 1A according to the second embodiment differs from the module 1 according to the first embodiment, described with reference to FIGS. 1A to 7, in the following ways. In the module 1 according to the first embodiment, the first trench 5 on the upper side of the circuit board 2 and the second trench 11 on the lower side of the circuit board 2 have parts that overlap with each other, as illustrated in FIG. 5. As opposed to this, in the module 1A according to the second embodiment, the first trench 5A on the upper side of the circuit board 2 and the second trench 11A on the lower side of the circuit board 2 do not have parts that overlap with each other, as illustrated in FIG. 9. The rest of the configuration is the same as in the module 1 according to the first embodiment, and thus the same reference signs will be used, and descriptions thereof will be omitted.

As illustrated in FIGS. 8A and 10, the first trench 5A is formed in the first sealing resin layer 4 so as to be positioned between the first electronic components 3a and the second electronic components 3b when viewed in plan view. As illustrated in FIGS. 8B and 10, the second trench 11A is formed so as to be positioned between the third electronic components 9a and the fourth electronic components 9b when viewed in plan view. In the second embodiment, the first trench 5A and the second trench 11A do not have parts that overlap when viewed in plan view, as illustrated in FIG. 9.

As illustrated in FIG. 10, the first trench 5A is formed extending from the upper surface 4a of the first sealing resin layer 4, toward the surface on the side opposite from the upper surface 4a of the first sealing resin layer 4 and reaching that opposite-side surface. In other words, the first trench 5A passes through the first sealing resin layer 4.

As illustrated in FIG. 10, the second trench 11A is formed extending from the lower surface 10a of the second sealing resin layer 10, toward the surface on the side opposite from the lower surface 10a of the second sealing resin layer 10 and reaching that opposite-side surface. In other words, the second trench 11A passes through the second sealing resin layer 10.

Thus, according to the above-described second embodiment, at least a part of the circuit board 2 on the other main surface 2b side can be prevented from being damaged at the part where the first trench 5A is formed in plan view, when forming the first trench 5A and the second trench 11A through laser processing, for example. Additionally, a part of the circuit board 2 on the one main surface 2a side can be prevented from being damaged at the part where the second trench 11A is formed in plan view. This makes it possible to suppress breakage in the circuit board.

Note that the present disclosure is not intended to be limited to the above-described embodiments, and many changes aside from the content described above can be made without departing from the present disclosure.

For example, in the above-described first embodiment, at the part where the first trench 5 and the second trench 11 overlap when viewed in plan view, the first trench 5 is formed so as to pass through the first sealing resin layer 4, and the second trench 11 is formed so as not to pass through the second sealing resin layer 10. However, the configuration is not limited thereto. For example, at the part where the first trench 5 and the second trench 11 overlap when viewed in plan view, the first trench 5 may be formed so as not to pass through the first sealing resin layer 4, and the second trench 11 may be formed so as to pass through the second sealing resin layer 10. Additionally, at the part where the first trench 5 and the second trench 11 overlap when viewed in plan view, the first trench 5 may be formed so as not to pass through the first sealing resin layer 4, and the second trench 11 may be formed so as not to pass through the second sealing resin layer 10.

Additionally, in the above-described second embodiment, the first trench 5A is formed so as to pass through the first sealing resin layer 4, and the second trench 11A is formed so as to pass through the second sealing resin layer 10. However, the configuration is not limited thereto. For example, the first trench 5A may be formed so as not to pass through the first sealing resin layer 4, and the second trench 11A may be formed so as to pass through the second sealing resin layer 10. Additionally, the first trench 5A may be formed so as to pass through the first sealing resin layer 4, and the second trench 11A may be formed so as not to pass through the second sealing resin layer 10. Furthermore, the first trench 5A may be formed so as not to pass through the first sealing resin layer 4, and the second trench 11A may be formed so as not to pass through the second sealing resin layer 10.

Additionally, in the above-described first embodiment, the second metal film 15 is also provided in the part where the first trench 5 and the second trench 11 overlap when viewed in plan view. However, the configuration is not limited thereto, and the second metal film 15 need not be provided in the part where the first trench 5 and the second trench 11 overlap when viewed in plan view.

The content of the above-described embodiments and variations may be combined as well.

INDUSTRIAL APPLICABILITY

The present disclosure can be applied in a module in which trenches are formed in a sealing resin layer that seals a component mounted on a circuit board.

REFERENCE SIGNS LIST 1, 1A MODULE
2 CIRCUIT BOARD
3a FIRST ELECTRONIC COMPONENTS
3b SECOND ELECTRONIC COMPONENTS
4 FIRST SEALING RESIN LAYER
5 FIRST TRENCH
6 FIRST SHIELD LAYER
6a FIRST SHIELD PART
9a THIRD ELECTRONIC COMPONENTS
9b FOURTH ELECTRONIC COMPONENTS
10 SECOND SEALING RESIN LAYER
11 SECOND TRENCH
12 SECOND SHIELD LAYER
12a SECOND SHIELD PART
12b THIRD SHIELD PART
13 MOUNTING TERMINAL ELECTRODES

The invention claimed is:
1. A module comprising:
a circuit board having one main surface and another main surface;
a first component and a second component mounted on the one main surface;
a first sealing resin layer that seals the one main surface, and the first component and the second component;
a third component and a fourth component mounted on the other main surface; and
a second sealing resin layer that seals the other main surface, and the third component and the fourth component,
wherein a first trench is provided in the first sealing resin layer, the first trench being provided between the first component and the second component when viewed in plan view from a direction perpendicular to the one main surface;

a second trench is provided in the second sealing resin layer, the second trench being provided between the third component and the fourth component when viewed in the plan view;

the module further includes:
　a first shield part disposed in the first trench; and
　a second shield part disposed in the second trench;

a part of the first trench overlaps with the second trench when viewed in the plan view from the direction perpendicular to the one main surface;

at the part where the trenches overlap with each other, the second trench does not pass through the second sealing resin layer from an outer surface of the second sealing resin layer to the another main surface; and a part of the second sealing resin layer remains where the second trench does not pass through the second resin layer.

2. The module according to claim 1, further comprising:

a mounting terminal electrode provided on the other main surface, the mounting terminal electrode being exposed from the second sealing resin layer; and a third shield part that covers the second sealing resin layer while isolating an exposed surface of the mounting terminal electrode.

3. The module according to claim 2, further comprising:
a fourth shield part layered on a side surface of each of the first sealing resin layer, the second sealing resin layer, and the circuit board.

4. The module according to claim 1,
wherein the first trench and the second trench are configured to not overlap with each other when viewed in the plan view.

5. The module according to claim 4, further comprising:
a fourth shield part layered on a side surface of each of the first sealing resin layer, the second sealing resin layer, and the circuit board.

6. The module according to claim 1, further comprising:
a fourth shield part layered on a side surface of each of the first sealing resin layer, the second sealing resin layer, and the circuit board.

7. The module according to claim 1, further comprising:
a mounting terminal electrode provided on the other main surface, the mounting terminal electrode being exposed from the second sealing resin layer; and
a third shield part that covers the second sealing resin layer while isolating an exposed surface of the mounting terminal electrode.

8. The module according to claim 1, further comprising:
a fourth shield part layered on a side surface of each of the first sealing resin layer, the second sealing resin layer, and the circuit board.

* * * * *